US008386970B2

(12) United States Patent
Ueda

(10) Patent No.: US 8,386,970 B2
(45) Date of Patent: Feb. 26, 2013

(54) REPLACING SINGLE-CUT VIA INTO MULTI-CUT VIA IN SEMICONDUCTOR INTEGRATED CIRCUIT DESIGN

(75) Inventor: Toshiaki Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/428,286

(22) Filed: Mar. 23, 2012

(65) Prior Publication Data
US 2012/0180007 A1 Jul. 12, 2012

Related U.S. Application Data

(62) Division of application No. 12/582,014, filed on Oct. 20, 2009, now Pat. No. 8,171,445, which is a division of application No. 11/637,744, filed on Dec. 13, 2006, now Pat. No. 7,634,751.

(30) Foreign Application Priority Data

Dec. 14, 2005 (JP) ................. 2005-360907

(51) Int. Cl.
G06F 17/50 (2006.01)
(52) U.S. Cl. .......... 716/54; 716/126; 716/129; 716/130; 716/131
(58) Field of Classification Search .............. 716/54, 716/126, 129–131
See application file for complete search history.

(56) References Cited

U.S. PATENT DOCUMENTS

| 5,638,292 | A | 6/1997 | Ueda |
| 5,984,510 | A | 11/1999 | Guruswamy et al. |
| 6,026,224 | A * | 2/2000 | Darden et al. ............ 716/112 |
| 6,078,737 | A | 6/2000 | Suzuki |
| 6,536,023 | B1 | 3/2003 | Mohan et al. |
| 6,556,658 | B2 | 4/2003 | Brennan |
| 6,637,013 | B1 | 10/2003 | Li |
| 6,718,527 | B2 * | 4/2004 | Li ............................ 716/120 |
| 6,953,956 | B2 | 10/2005 | Or-Bach et al. |
| 7,089,511 | B2 * | 8/2006 | Allen et al. ................ 716/103 |
| 7,105,871 | B2 | 9/2006 | Or-Bach et al. |
| 7,171,635 | B2 | 1/2007 | Teig et al. |
| 7,272,810 | B2 | 9/2007 | Orita |
| 7,340,711 | B2 | 3/2008 | Hetzel et al. |
| 7,571,416 | B2 | 8/2009 | Watanabe |
| 7,949,982 | B2 | 5/2011 | Ueda |
| 2005/0280159 | A1 | 12/2005 | Okumura |
| 2006/0048088 | A1 | 3/2006 | Nakano |
| 2006/0080576 | A1 | 4/2006 | Hirano |
| 2006/0090144 | A1 | 4/2006 | Lakshmanan et al. |
| 2006/0197573 | A1 | 9/2006 | Matsumura et al. |
| 2007/0101307 | A1 | 5/2007 | Ueda |

FOREIGN PATENT DOCUMENTS

JP 11-265940 A 9/1999

\* cited by examiner

*Primary Examiner* — Naum Levin
(74) *Attorney, Agent, or Firm* — Foley & Lardner LLP

(57) ABSTRACT

According an aspect of the invention, there is provided a design support system of a semiconductor integrated circuit includes: a first unit configured to determine a wiring path by calculating wiring resource consuming information for carrying out a connection through a multi-cut via in case that the connection is carried out through the multi-cut via in a wiring region having a plurality of layers; and a second unit configured to replacing a single-cut via into the multi-cut via.

4 Claims, 8 Drawing Sheets

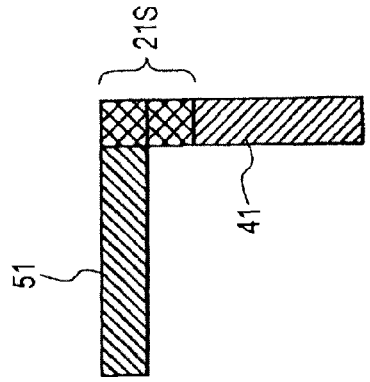
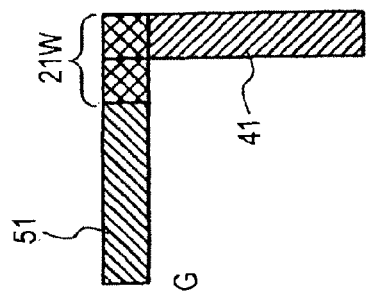
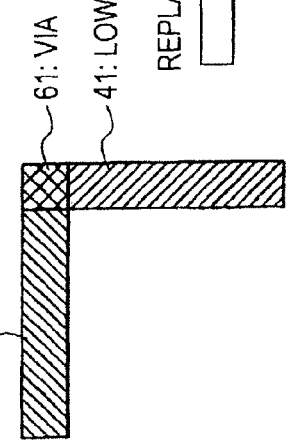
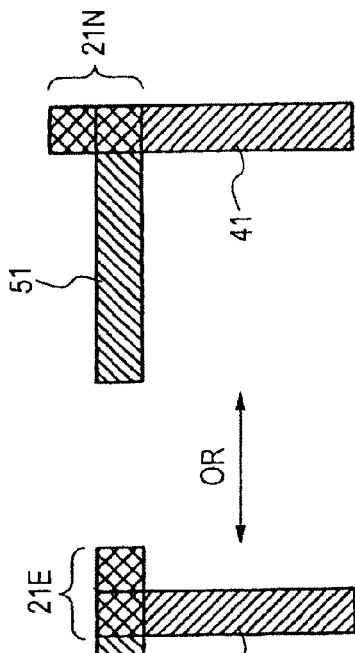
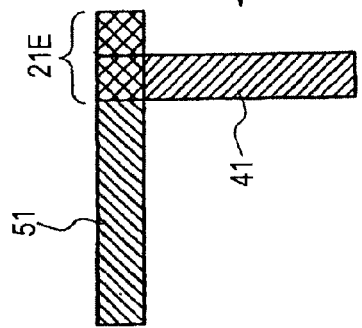

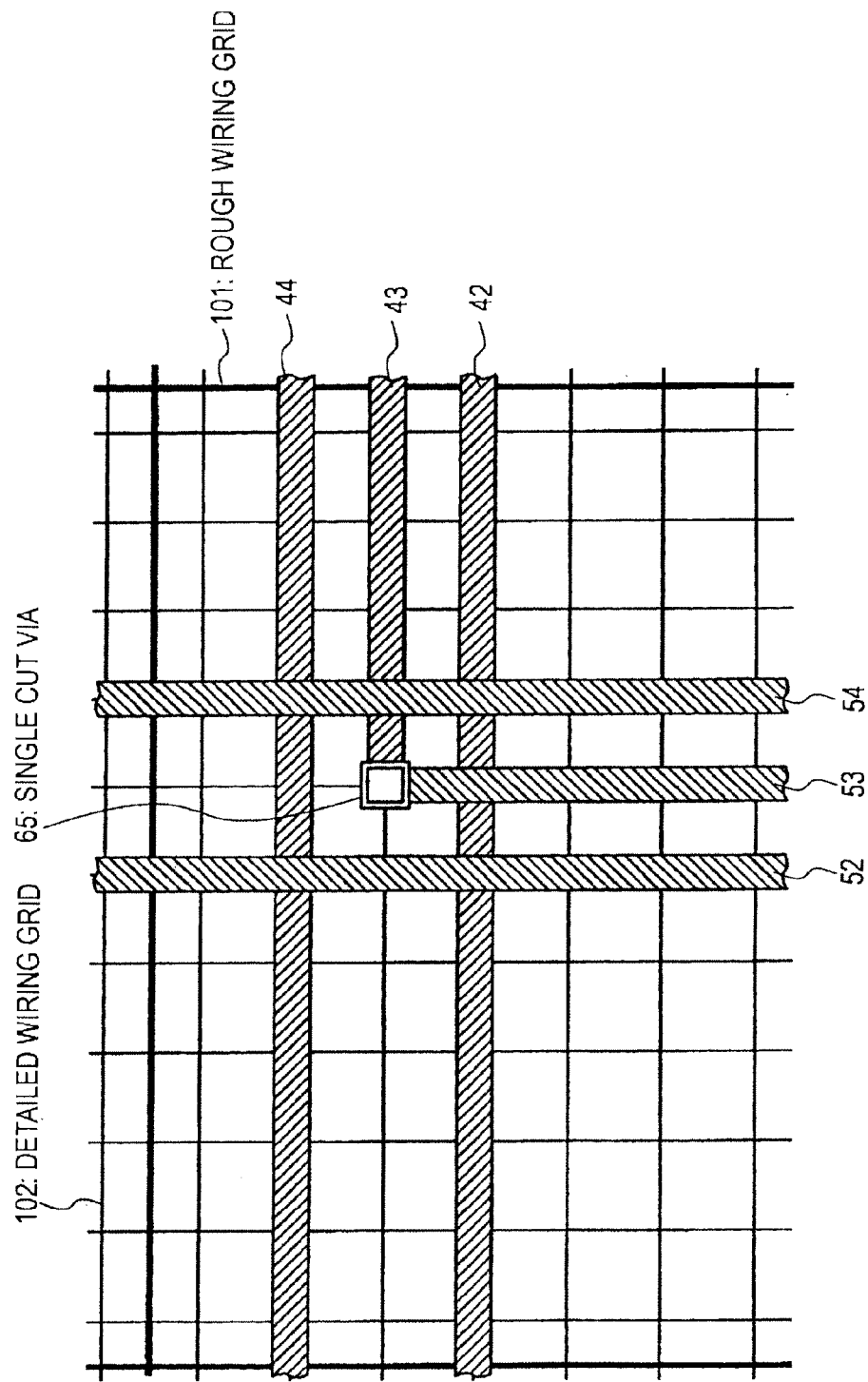

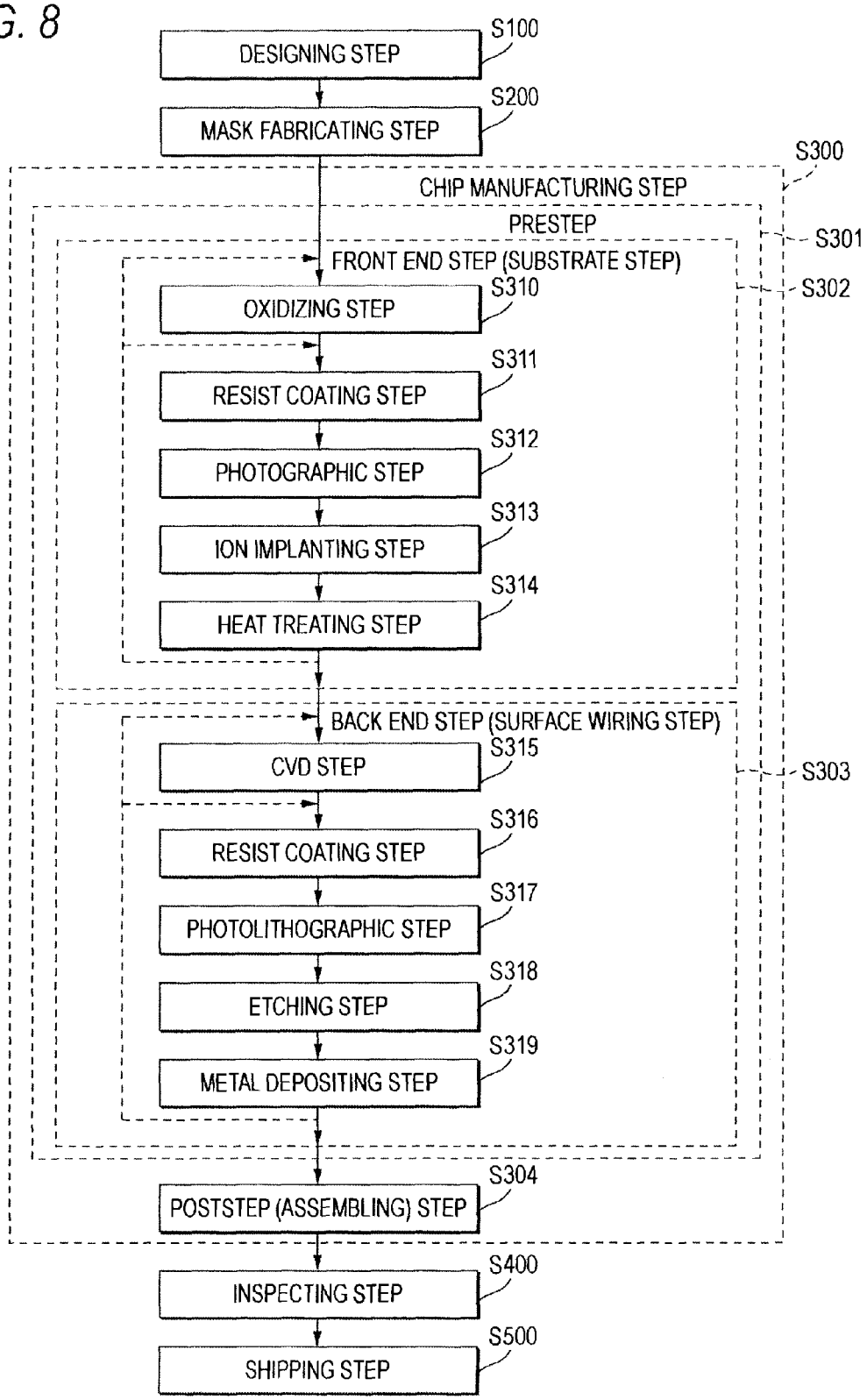

REPLACING SINGLE-CUT VIA INTO MULTI-CUT VIA IN SEMICONDUCTOR INTEGRATED CIRCUIT DESIGN

CROSS-REFERENCE TO RELATED APPLICATIONS

The present application is a Divisional of U.S. Ser. No. 12/582,014 filed Oct. 20, 2009, now U.S. Pat. No. 8,171,445 which is a Divisional of U.S. Ser. No. 11/637,744 filed Dec. 13, 2006, now U.S. Pat. No. 7,634,751 which is based upon and claims the benefit of priority from the prior Japanese Patent Application No. 2005-360907, filed on Dec. 14, 2005; the entire contents of which are incorporated herein by reference.

BACKGROUND

1. Technical Field

The present invention relates to a design support system of a semiconductor integrated circuit, a method of designing a semiconductor integrated circuit, a design support program of a semiconductor integrated circuit, and a method of manufacturing a semiconductor integrated circuit.

2. Description of Related Art

In a design of a semiconductor integrated circuit, a cell or a block which has a logic function and a storing function is disposed in a chip, their input/output terminals are wired respectively and a pattern layout on a chip area is thus determined in order to obtain a desirable circuit operation. A semiconductor integrated circuit using a general gate array method is constituted by a region in which a cell is to be disposed, a region in which a wiring between the cells is provided and a region in which an input/output circuit provided on a periphery is disposed. A plurality of wiring layers can be utilized for the wiring on the chip and other layers can be assigned to wirings in horizontal and vertical directions, respectively. In a layout design of the semiconductor integrated circuit, an arrangement of a cell and a wiring between terminals are automatically optimized by using a calculator to determine a layout pattern over a whole surface of a chip area (for example, see JP-A-11-265940).

In recent years, a microfabrication of dimensions of a transistor and a wiring which are to be manufactured on a wafer has been advanced and it has been hard to execute a manufacturing process in accordance with a design pattern intended in the beginning. A technique for forming a fine hole on an interlayer insulating film over a semiconductor substrate and processing a via for connecting wirings of upper and lower layers has also become increasingly hard. For this reason, a circuit pattern on a wafer which is actually manufactured is greatly influenced by a factor for a fluctuation in a manufacture, resulting in a poor reliability of an electrical connection so that a deterioration in a yield is caused. In a technology after the generation of a gate length of 130 nm, particularly, a rate of defects caused by a connecting failure of a via hole has been increased. By using a multi-cut via having a plurality of holes for a connection between wiring layers, therefore, it has been devised to decrease a probability of a failure as greatly as possible.

In a related-art automatic layout method, however, it is first supposed that a single via (a single cut via) is provided over a whole chip and a detailed wiring is provided, and a replacement with a multi-cut via is then carried out only in the case in which a permission can be made in consideration of a peripheral layout situation. More specifically, in the conventional automatic layout method, there is not considered a consumption of an adjacent wiring region which is caused by the provision of the multi-cut via in a wiring path search stage. For this reason, it is impossible to carry out a global optimization of a wiring processing on the assumption of the provision of the multi-cut via. Even if a wiring interval is increased by using a wire spreading function, it is hard to carry out a replacement of the multi-cut via in a place in which the bend of a wiring segment at a minimum interval between adjacent wirings defined in a predetermined process and a crank of a parallel wiring locally concentrate. Thus, there is a limit to optimize a layout pattern having a bad influence on the manufacture of a semiconductor integrated circuit after the wiring processing.

SUMMARY

According to an aspect of the invention, there is provided a design support system of a semiconductor integrated circuit includes: a first unit configured to determine a wiring path by calculating wiring resource consuming information for carrying out a connection through a multi-cut via in case that the connection is carried out through the multi-cut via in a wiring region having a plurality of layers; and a second unit configured to replacing a single-cut via into the multi-cut via.

According to another aspect of the invention, there is provided a method of designing a semiconductor integrated circuit comprising: causing a rough wiring unit to allocate a rough wiring path to a wiring region having a plurality of layers, to estimate the number of vias generated in the rough wiring path, to calculate necessary wiring resource consuming information for carrying out a connection through a multi-cut via in order to provide a detailed wiring based on the rough wiring path, to refer to a wiring congestion degree calculated for each of a plurality of rectangular regions obtained by dividing the wiring region, and to equalize the wiring congestion degree including a provision of the multi-cut via and to assign the rough wiring path, thereby causing a wiring information storing portion to carry out a storage; causing a detailed wiring unit to read the rough wiring path, to provide a detailed wiring in the wiring region by using the wiring resource consuming information, and to store a result of the detailed wiring in the wiring information storing portion; and causing a multi-cut via replacing unit to read the result of the detailed wiring and to replace a via connecting the wiring region with the multi-cut via.

According to yet another aspect of the invention, there is provided a design support program of a semiconductor integrated circuit for causing a computer to execute: causing a rough wiring unit to allocate a rough wiring path to a wiring region having a plurality of layers, to estimate a number of via generated in the rough wiring path, to calculate necessary wiring resource consuming information for carrying out a connection through a multi-cut via in order to provide a detailed wiring based on the rough wiring path, to refer to a wiring congestion degree calculated for each of a plurality of rectangular regions obtained by dividing the wiring region, and to equalize the wiring congestion degree including a provision of the multi-cut via and to assign the rough wiring path, thereby causing a wiring information storing portion to carry out a storage; causing a detailed wiring unit to read the rough wiring path, to provide a detailed wiring in the wiring region by using the wiring resource consuming information, and to store a result of the detailed wiring in the wiring information storing portion; and causing a multi-cut via replacing unit to read the result of the detailed wiring and to replace a via connecting the wiring region with the multi-cut via.

According to a further aspect of the invention, there is provided a method of manufacturing a semiconductor integrated circuit comprising: causing a design support system to allocate a rough wiring path to a wiring region having a plurality of layers, to estimate a number of via generated in the rough wiring path, to calculate necessary wiring resource consuming information for carrying out a connection through a multi-cut via in order to provide a detailed wiring based on the rough wiring path, to refer to a wiring congestion degree calculated for each of a plurality of rectangular regions obtained by dividing the wiring region having the layers, to equalize the wiring congestion degree including a provision of the multi-cut via and to assign the rough wiring path, thereby causing a wiring information storing portion to carry out a storage, to read the rough wiring path, to provide a detailed wiring in the wiring region having the layers by using the wiring resource consuming information, and to store a result of the detailed wiring in the wiring information storing portion, to read the result of the detailed wiring and to replace the via connecting the wiring region having the layers with the multi-cut via; manufacturing a mask by using data on the result of the detailed wiring which is replaced with the multi-cut via; and transferring a pattern of the mask onto a semiconductor wafer.

BRIEF DESCRIPTION OF THE EMBODIMENTS

FIGS. 5A to 5E are explanatory diagram showing a via replacing method of a semiconductor integrated circuit according to the embodiment.

FIG. 7 is an exemplary diagram showing a layout, illustrating a comparative example.

FIG. 8 is an exemplary flowchart showing an example of a method of manufacturing a semiconductor integrated circuit according to the embodiment.

DESCRIPTION OF THE EMBODIMENTS

Next, embodiments will be described with reference to the drawings. In the following description of the drawings, the same or similar portions have the same or similar designations. The drawings are typical and attention is to be paid to the fact that a relationship between a thickness and a planar dimension and a ratio of thicknesses of respective layers are different from actual ones. Accordingly, it is necessary to decide specific thicknesses and dimensions in consideration of the following description. Moreover, it is a matter of course that portions having a different relationship and ratio of mutual dimensions are also included in the mutual drawings. In the embodiment which will be described below, moreover, an apparatus and a method for materializing the technical thought of the invention are illustrative, and the technical thought of the invention cannot specify a material, a shape, a structure and an arrangement of a component in the following manner. The technical thought of the invention can be variously changed in the claims.

(Design Support System of Semiconductor Integrated Circuit)

Figure 1:
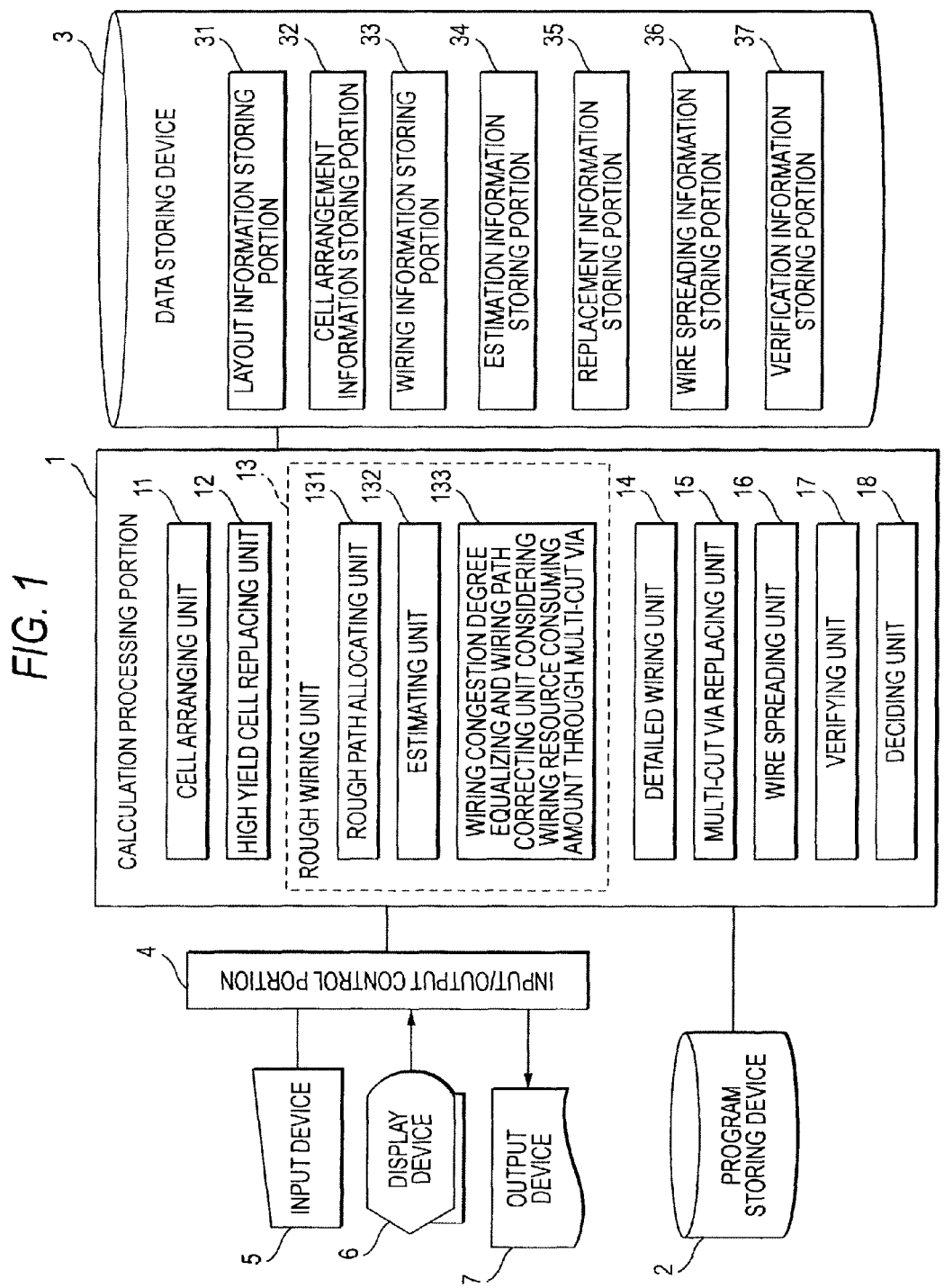
FIG. 1 is an exemplary block diagram showing an example of a design support system according to an embodiment of the invention.
Figure 2:
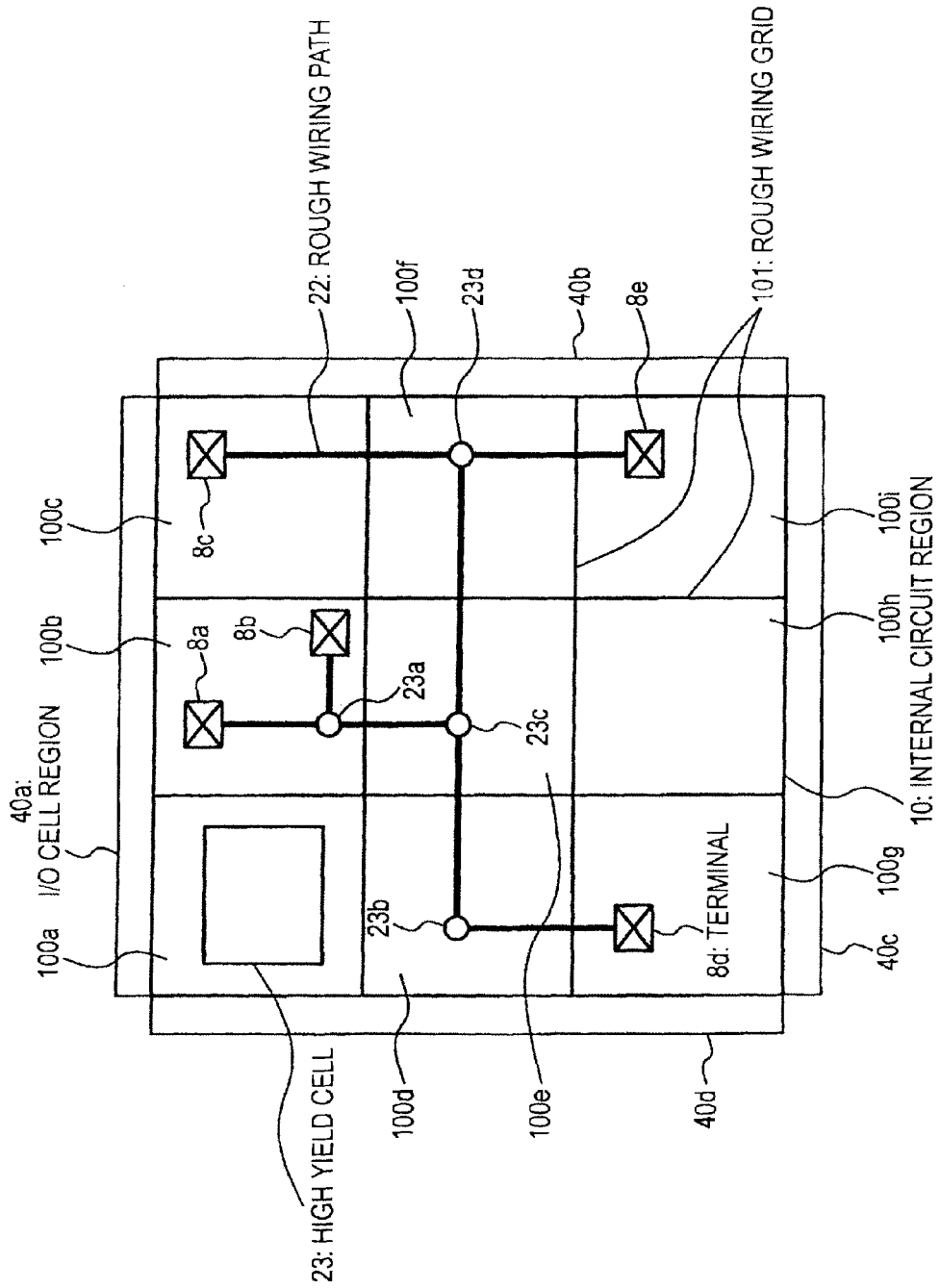
FIG. 2 is an exemplary diagram showing an example of a layout of a semiconductor integrated circuit according to the embodiment.

As shown in FIGS. 1 and 2, a design support system of a semiconductor integrated circuit according to the embodiment of the invention comprises a rough wiring unit 13 for allocating a rough wiring path 22 to a wiring region having a plurality of layers, estimating the number of vias generated in the rough wiring path 22, calculating necessary wiring resource consuming information for carrying out a connection through a multi-cut via in order to provide a detailed wiring based on the rough wiring path 22, referring to a wiring congestion degree calculated for each of a plurality of rectangular regions 100a to 100i obtained by dividing an internal circuit region 10, thereby equalizing the wiring congestion degree considering a wiring resource consuming amount by a provision of the multi-cut via and assigning the rough wiring path 22, a detailed wiring unit 14 for providing a detailed wiring in the wiring region having the layers, and a multi-cut via replacing unit 15 for replacing a via for connecting the wiring region having the layers with the multi-cut via. The "wiring resource consuming information" indicates information about the number of adjacent wiring tracks (the number of adjacent wiring paths) which can be consumed when the multi-cut via is to be provided in the internal circuit region 10.

The rough wiring unit 13, the detailed wiring unit 14 and the multi-cut via replacing unit 15 can be constituted as a part of a calculation processing portion (CPU) 1 of a computer system. An input device 5 for accepting an input from an operator, a display device 6 for displaying a result of a processing of the CPU 1 and a layout result of a chip, an output device 7, and a program storing device 2 for storing various programs required for a calculation processing of the CPU 1 are connected to the CPU 1. The input device 5, the display device 6 and the output device 7 are connected to an input/output control portion 4. The CPU 1 further includes a cell arranging unit 11, a high yield cell replacing unit 12, a wire spreading unit 16, a verifying unit 17 and a deciding unit 18.

The cell arranging unit 11 arranges a logical cell, a macro cell and an input/output cell in a chip area of a semiconductor integrated circuit disposed virtually in a memory space of the design support system in FIG. 1 based on a floor plan and cell connecting information which are stored in a data storing device 3. The high yield cell replacing unit 12 replaces the cell arranged by the cell arranging unit 11 with a high yield cell 23 illustrated in FIG. 2. The "high yield cell" indicates a cell in which an external shape (size) thereof and arrangement positions of an element and a wiring included in the cell are previously optimized in consideration of a yield.

The rough wiring unit 13 includes a rough path allocating unit 131, an estimating unit 132, and a wiring congestion degree equalizing and wiring path correcting unit 133 considering a wiring resource consuming amount through a multi-cut via. The rough path allocating unit 131 extracts layout information stored in the data storing device 3 and allocates a rough wiring path for connecting terminals 8a, 8b, 8c, 8d and 8e having the same connecting request which are disposed in the internal circuit region 10 as is illustrated in FIG. 2. The internal circuit region 10 is divided into a plurality of rectangular regions 100a, 100b, 100c, 100d, 100e, 100f, 100g, 100h and 100i through a rough wiring grid 101. I/O cell regions 40a, 40b, 40c and 40d for disposing the input/output cell are provided in a peripheral portion of the internal circuit region 10.

The estimating unit 132 estimates the number of generated vias from information about an intersecting point of Steiner Tree of the rough wiring path 22 connecting the terminals 8a to 8d in order to calculate the necessary wiring resource consuming information for connecting the rough wiring path 22 through the multi-cut via. The wiring congestion degree equalizing and wiring path correcting unit 133 considering the wiring resource consuming amount through the multi-cut via reads the number of the generated vias which is estimated by the estimating unit 132 and calculates the wiring resource consuming information, and equalizes a wiring congestion degree and optimizes the allocation of the rough wiring path to correct the rough wiring path 22 based on the wiring congestion degree considering the wiring resource consuming amount through the multi-cut via which is calculated for each of the rectangular regions 100a to 100i.

A specific method of calculating the wiring resource consuming information can be implemented by calculating a cost imposed on a wiring path provided on a periphery of the via in a wiring path search of a detailed wiring step which will be described below in consideration of an excessive consumption of a wiring resource which is caused by a change into a multi-cut via. For example, it is assumed that the excessive consumption of the wiring resource through the change into the multi-cut via is generated at a specified probability around the rough wiring path 22 passing through the rectangular regions 100a to 100i to be L-shaped. In FIG. 2, the rough wiring path 22 passes like an L-shape in the rectangular regions 100b, 100d, 100e and 100f. In this case, the wiring congestion degree equalizing and wiring path correcting unit 133 considering the wiring resource consuming amount through the multi-cut via selectively adds a cost corresponding to the excessive consumption of the wiring resource through the change into the multi-cut via as a margin of the wiring resource consuming information to the rectangular regions 100b, 100d, 100e and 100f.

The "wiring congestion degree" can be evaluated by calculating a rate of the number of rough wirings allocated actually to the total number of rough wiring tracks which is preset in the rectangular regions 100a to 100i, for example. The "optimization of rough wiring path allocation" means that various parameters required for a wiring path search, for example, the wiring resource consuming information, a via periphery congestion relaxing parameter and an adjacent wiring control parameter are optimized to equalize the wiring congestion degree considering the wiring resource consuming amount through the multi-cut via, thereby determining the rough wiring path 22.

The "via periphery congestion relaxing parameter" indicates a condition related to weighting for a degree to avoid a wiring around the via. The "adjacent wiring control parameter" indicates a condition for suppressing a close aggregation of adjacent wirings. For the adjacent wiring control parameter, there is set a condition for moving a part of the rough wiring path 22 to a plurality of wiring regions for second and succeeding layers to equalize the wiring congestion degree in first to kth wiring layers (k is an integer of 2 or more) when the rough wiring path 22 set to a wiring region for a first layer exceeds a specified value of the wiring congestion degree.

Figure 3:
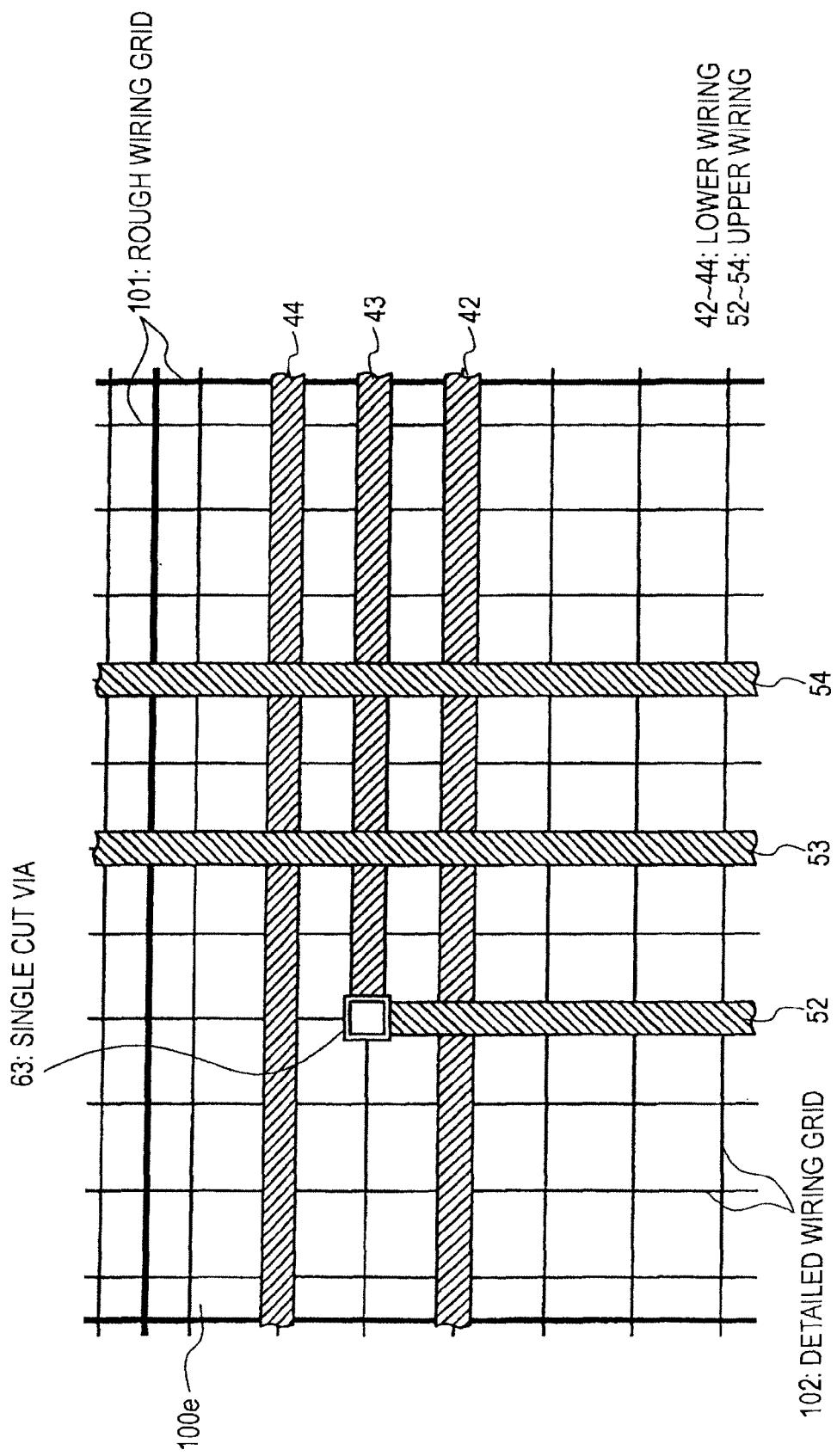
FIG. 3 is an exemplary diagram showing an example of a layout, illustrating a method of designing a semiconductor integrated circuit according to the embodiment.

The detailed wiring unit 14 refers to the wiring resource consuming information and a result of the wiring of the rough wiring path 22 which are optimized by the wiring congestion degree equalizing and wiring path correcting unit 133 considering the wiring resource consuming amount through the multi-cut via, thereby wiring lower wirings 42, 43 and 44 extended in a horizontal direction and upper wirings 52, 53 and 54 extended in a vertical direction in FIG. 3 which are provided on a detailed wiring grid 102 set into the rough wiring grid 101 and connecting the lower wiring 43 to the upper wiring 52 through a single cut via 63 as shown in FIG. 3. A grid size of the detailed wiring grid 102 is determined based on a design rule of the semiconductor integrated circuit. In FIG. 3, the detailed wiring grid 102 is provided in a size specified in a fineness for dividing one rough wiring grid 101 into 11 equal parts in vertical and horizontal directions, respectively. A width of the wiring grid of the detailed wiring is set to be a minimum wiring space in respect of a design rule.

The detailed wiring unit 14 can dispose a plurality of virtual terminals in a plurality of wiring regions and can determine a wiring path between the virtual terminals by using a labyrinth method or a segment searching method. The "labyrinth method" sets one of the virtual terminals to be a source and the other to be a target and labels a distance from the source into the rectangular region in such a manner that a wave spreads from the source. Consequently, it is possible to calculate the shortest wiring path between the source and the target. In the case in which the labyrinth method is used, the detailed wiring unit 14 reads the wiring resource consuming information which is optimized by the wiring congestion degree equalizing and wiring path correcting unit 133 considering the wiring resource consuming amount through the multi-cut via and imposes a high cost on the periphery of the rectangular region on which the via is provided, thereby obtaining the shortest path of the detailed wiring avoiding the wiring around the via.

On the other hand, the "segment searching method" can obtain a path in which a wiring is less bent than that in the labyrinth method by generating a segment to be a candidate of the wiring path between the virtual terminals set in the wiring regions and searching for the wiring path between the terminals in order to minimize the number of the segments. In the case in which the segment searching method is used, the detailed wiring unit 14 reads the wiring resource consuming information optimized by the wiring congestion degree equalizing and wiring path correcting unit 133 considering the wiring resource consuming amount through the multi-cut via and imposes a high cost on the periphery of the rectangular region in which the via is provided, thereby obtaining a path in which the wiring is less bent except for the periphery of the via.

Figure 4:
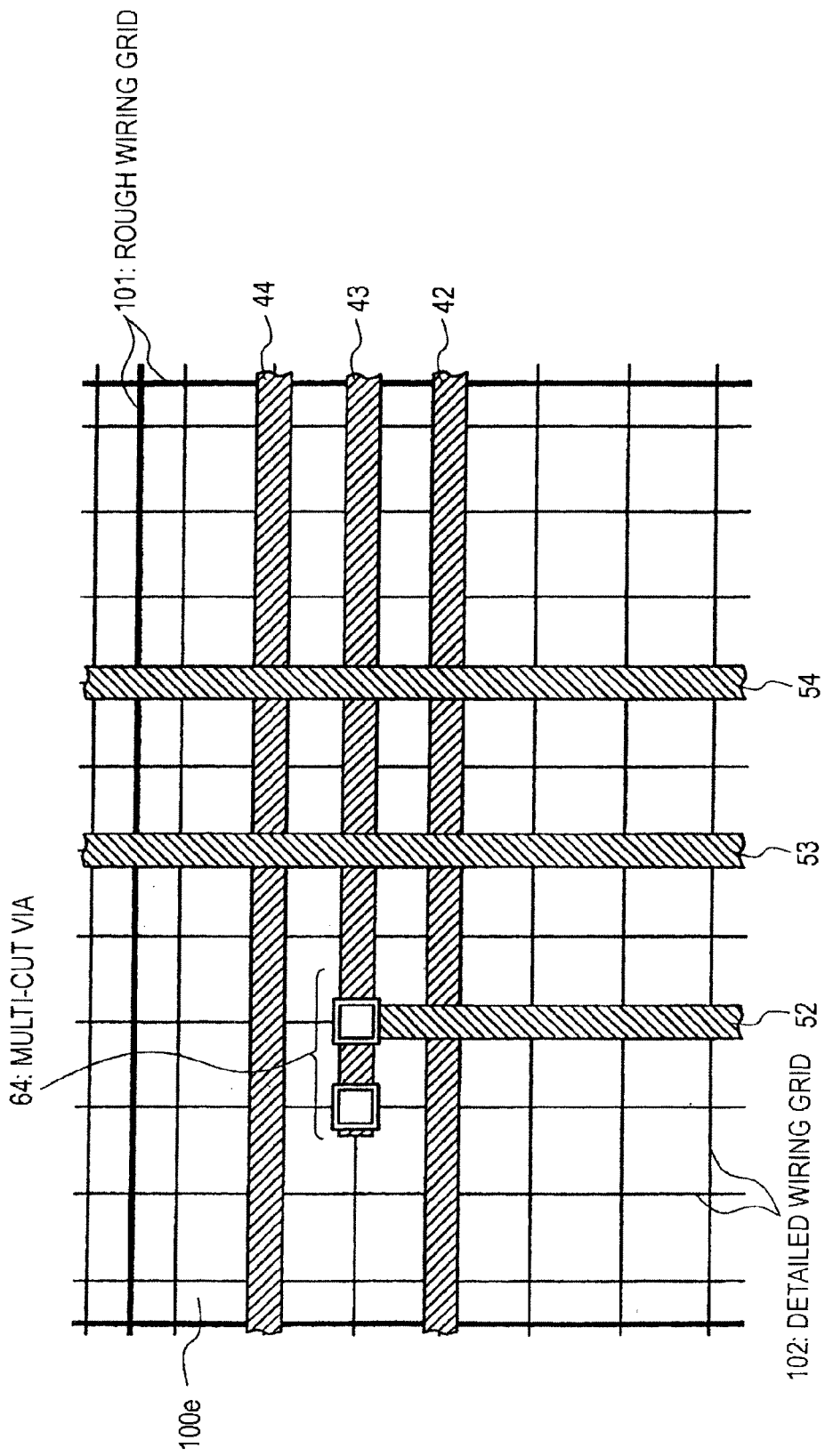
FIG. 4 is an exemplary diagram showing an example of the layout, illustrating the method of designing a semiconductor integrated circuit according to the embodiment.

The multi-cut via replacing unit 15 replaces the single cut via 63 shown in FIG. 3 which is connected by the detailed wiring unit 14 with a multi-cut via 64 shown in FIG. 4. Description will be given to an example of a replacing method to be executed by the multi-cut via replacing unit 15 with reference to FIGS. 5A to 5E. As shown in FIG. 5A, it is assumed that a layout shape having a lower wiring 41 extended in a vertical direction and an upper wiring 51 extended in a horizontal direction which are connected through a single via 61 is set to be an original via. First of all, the multi-cut via replacing unit 15 preferentially generates a first replacement pattern having a multi-cut via 21W overlapping with the upper wiring 51 as shown in FIG. 5B or a second replacement pattern having a multi-cut via 21S overlapping with the lower wiring 41 as shown in FIG. 5C.

In the case in which the first replacement pattern and the second replacement pattern are generated to cause a violation of a design rule of a semiconductor integrated circuit to be a design target, the multi-cut via replacing unit 15 generates a third replacement pattern having a multi-cut via 21E protruded in a direction of extension of the upper wiring 51 as shown in FIG. 5D or a fourth replacement pattern having a multi-cut via 21N protruded in a direction of extension of the lower wiring 41 as shown in FIG. 5E. Even if the third replacement pattern and the fourth replacement pattern are generated, the replacement with the multi-cut via is stopped to return to a state of the original via shown in FIG. 5A when the violation of a design rule is further caused.

The wire spreading unit 16 reads wire spreading information stored in the data storing device 3 and enlarges a wiring space between wirings for connecting the detailed wiring unit 14 and the multi-cut via replacing unit 15. The verifying unit 17 executes a verification and correction as to whether the semiconductor integrated circuit has a circuit drawback portion such as a wiring short circuit, a physical verification and correction to be carried out by a DRC or an LVS, an OPC/MDP processing and verification, and a lithographic verification. The deciding unit 18 reads information about the replacement rate of the multi-cut via which is stored in the data storing device 3 and decides whether the replacement rate of the multi-cut via exceeds a specified replacement rate or not.

The data storing device 3 shown in FIG. 1 includes a layout information storing portion 31, a cell arrangement information storing portion 32, a wiring information storing portion 33, an estimation information storing portion 34, a replacement information storing portion 35, a wire spreading information storing portion 36 and a verification information storing portion 37. Various layout information about a floor plan, a net list, a connecting request, a timing restriction and an arranged wiring are stored in the layout information storing portion 31. For the layout information, it is also possible to input information created in a predetermined data format related to a design and a library from the input device 5 via a computer network which is not shown.

Information about shapes of a logical cell, an input/output cell and a high yield cell and restriction information about a connecting request are stored in the cell arrangement information storing portion 32. Information about a rough wiring result, a detailed wiring result and a wiring result obtained after the replacement with the multi-cut via are stored in the wiring information storing portion 33. Necessary information for calculating the wiring resource consuming information of the multi-cut via are stored in the estimation information storing portion 34. Various information about the replacement with the multi-cut via are stored in the replacement information storing portion 35. Information for executing the wire spreading is stored in the wire spreading information storing portion 36. Necessary information for a circuit verification, a physical verification, an OPC processing, an MDP processing and a lithographic verification are stored in the verification information storing portion 37.

In FIG. 1, the program storing device 2 stores input/output data, a layout parameter and a history thereof, and data which are being calculated. The input device 5 includes a keyboard, a mouse, a write pen or a flexible disk device. An operator can specify the input/output data through the input device 5 and can set a necessary numeric value for an automatic design. Moreover, it is also possible to set a layout parameter such as a configuration of output data or to input an instruction for executing and stopping a calculation through the input device 5. The display device 6 and the output device 7 include a display and a printer device, respectively.

As will be further apparent from a method of designing a semiconductor integrated circuit which will be described below, according to the design support system of a semiconductor integrated circuit according to the embodiment, the estimating unit 132 of the rough wiring unit 13 estimates the number of the generated vias from information about an intersecting point of the Steiner Tree of the rough wiring path 22. Then, the wiring congestion degree equalizing and wiring path correcting unit 133 considering the wiring resource consuming amount through the multi-cut via calculates the wiring resource consuming information based on the number of the generated vias, and equalizes the wiring congestion degree and optimizes the allocation of the rough wiring path, thereby correcting the rough wiring path 22. In the allocation of the rough wiring path, consequently, the allocation of the wiring path is controlled up to a wiring resource limit. Therefore, it is possible to enhance the replacement rate from the single cut via to the multi-cut via after the detailed wiring. As a result, it is possible to provide a design support system capable of designing a semiconductor integrated circuit in which the number of residual single cut vias to be a factor of an electrical circuit failure is decreased and a reliability and a manufacturing yield are enhanced.

(Method of Designing Semiconductor Integrated Circuit)

Next, a method of designing a semiconductor integrated circuit using the design support system shown in FIG. 1 will be described with reference to a flowchart shown in FIG. 6.

At Step S10, various layout information required for the layout design of the semiconductor integrated circuit, for example, a floor plan and a net list are stored in the layout information storing portion 31 through the input device 5. For the layout information, it is also possible to use layout information created in a predetermined data format related to a design and a library which are obtained via a computer network which is not shown. Cell arrangement information of the semiconductor integrated circuit, estimation information, replacement information of a multi-cut via, wire spreading information and verification information, and a program are also stored in the cell arrangement information storing portion 32, the estimation information storing portion 34, the replacement information storing portion 35, the wire spreading information storing portion 36, the verification information storing portion 37 and the program storing device 2 through the input device 5.

At Step S11, the cell arranging unit 11 reads the layout information stored in the layout information storing portion 31 and arranges a logical cell, a macro cell and an input/output cell in a chip area of the semiconductor integrated circuit which is disposed virtually in a memory space of the design support system. A result of the arrangement of the cell is stored in the cell arrangement information storing portion 32.

At Step S12, the high yield cell replacing unit 12 reads the result of the arrangement of the cell and replaces the arranged cell with the high yield cell 23 illustrated in FIG. 2.

At Step S13, the rough wiring unit 13 executes a rough wiring. More specifically, at Step S131, the rough path allocating unit 131 extracts the layout information stored in the data storing device 3 and allocates the rough wiring path 22 for connecting the terminals 8a, 8b, 8c, 8d and 8e having the same connecting request which are disposed on the internal circuit region 10 in the chip area. A result of the allocation of the rough wiring path 22 is stored in the wiring information storing portion 33.

At Step S132, the estimating unit 132 reads the result of the allocation of the rough wiring path 22 and extracts the information about the intersecting point of the Steiner Tree of the rough wiring path 22 connecting the terminals 8a to 8d, thereby estimating the number of the generated vias from the information about the intersecting point. The estimation information about the number of the generated vias is stored in the estimation information storing portion 34.

At Step S133, the wiring congestion degree equalizing and wiring path correcting unit 133 considering the wiring resource consuming amount through the multi-cut via corrects the rough wiring path 22 into an optimum path for the replacement of the multi-cut via. More specifically, the wiring congestion degree equalizing and wiring path correcting unit 133 considering the wiring resource consuming amount through the multi-cut via reads the number of the generated vias which is estimated by the estimating unit 132 and calculates the wiring resource consuming information, and furthermore, optimizes the allocation of the rough wiring path while equalizing the wiring congestion degree based on the wiring congestion degree considering the wiring resource consuming amount through the multi-cut via.

For example, it is assumed that an excessive consumption of the wiring resource is caused by a change into the multi-cut via at a specified publication in the path passing through the rectangular regions 100a to 100i shown in FIG. 2 so as to be L-shaped. The wiring congestion degree equalizing and wiring path correcting unit 133 considering the wiring resource consuming amount through the multi-cut via sets, as a margin, an excessive consuming part of the wiring by the provision of the multi-cut via, thereby adding the same part to the wiring resource consuming information of the rectangular regions 100a to 100i in which the path passing like an L shape is present. In the example shown in FIG. 2, the rough wiring path 22 passes like the L shape in the rectangular regions 100b, 100d, 100e and 100f. For this reason, the wiring congestion degree equalizing and wiring path correcting unit 133 considering the wiring resource consuming amount through the multi-cut via increases a cost of the wiring resource consuming information of the rectangular regions 100b, 100d, 100e and 100f.

Similarly, the wiring congestion degree equalizing and wiring path correcting unit 133 considering the wiring resource consuming amount through the multi-cut via collates the wiring congestion degree calculated for each of the rectangular regions 100a to 100i, and at the same time, optimizes each information about a via peripheral congestion relaxing parameter and an adjacent wiring control parameter in such a manner that the wiring congestion degrees of a plurality of wiring layers provided on the rectangular regions 100a to 100i become uniform respectively, thereby correcting the rough wiring path 22. Consequently, the adjacent wiring is disposed with difficulty on the periphery of the L-shaped rough wiring path 22 in which the via is disposed. A result of the correction of the rough wiring path 22 is stored in the wiring information storing portion 33.

At Step S14, the detailed wiring unit 14 reads the wiring resource consuming information optimized by the wiring congestion degree equalizing and wiring path correcting unit 133 considering the wiring resource consuming amount through the multi-cut via and the result of the allocation of the rough wiring path 22, and disposes the lower wirings 42, 43 and 44 and the upper wirings 52, 53 and 54 on the detailed wiring grid 102 set onto the rough wiring grid 101 as shown in FIG. 3. The detailed wiring unit 14 further connects the lower wiring 43 and the upper wiring 52 through the single cut via 63. The result of the wiring of the detailed wiring is stored in the wiring information storing portion 33.

At Step S15, the multi-cut via replacing unit 15 reads the result of the wiring of the detailed wiring and replaces the single cut via 63 shown in FIG. 3 with the multi-cut via 64 shown in FIG. 4 based on the multi-cut via replacement information stored in the replacement information storing portion 35. A result of the replacement of the multi-cut via 64 is stored in the wiring information storing portion 33.

At Step S16, the deciding unit 18 reads the result of the replacement of the multi-cut via 64, thereby deciding a replacement rate based on the specified value of the multi-cut replacement rate stored in the layout information storing portion 31.

If the replacement rate does not exceed the specified value, the deciding unit 18 changes a part of the cell arrangement information stored in the cell arrangement information storing portion 32 and the wiring information stored in the wiring information storing portion 33 at Step S17 and the processing proceeds to the Step S13 (an engineering change order (ECO) step). The ECO step shown in the Step S17 can also be set by a designer or may be automatically set by using a program. If the replacement rate exceeds the specified value, the processing proceeds to Step S18.

At the Step S18, the wire spreading unit 16 reads the wiring information obtained after the multi-cut via replacement from the wiring information storing portion 33 and executes the wire spreading processing for the detailed wiring based on the wire spreading information stored in the wire spreading information storing portion 36. The wiring information obtained after the wire spreading processing is stored in the wiring information storing portion 33.

At Step S21, the wiring information obtained after the wire spreading which is stored in the wiring information storing portion 33 is output as mask data to the display device 6 or the output device 7.

At Step S22, the verifying unit 17 reads the mask data which are output, and verifies the mask data by using a software such as LVS or DRC stored in the verification information storing portion 37. A result of the verification is stored in the verification information storing portion 37.

At Step S23, the verifying unit 17 carries out an OPC processing and a verification based on the OPC processing information stored in the verification information storing portion 37 by referring to the information subjected to the LVS•DRC verification. A result of the verification of the OPC processing is stored in the verification information storing portion 37.

At Step S24, the verifying unit 17 carries out a lithographic verification based on a lithographic rule stored in the verification information storing portion 37 by referring to the information obtained after the OPC verification. A result of the lithographic verification is stored in the verification information storing portion 37. At Step S30, then, a manufacturing step using the result of the lithographic verification is executed.

As a comparative example, FIG. 7 shows an example of a layout pattern in the case in which a conversion into the multi-cut via is not taken into consideration. The lower wirings 42 and 44 and the upper wirings 52 and 54 are provided adjacently to each other around a single cut via 65 connecting the lower wiring 43 to the upper wiring 53. For this reason, the conversion into the multi-cut via cannot be carried out so that the single cut via 65 remains exactly.

Figure 6:
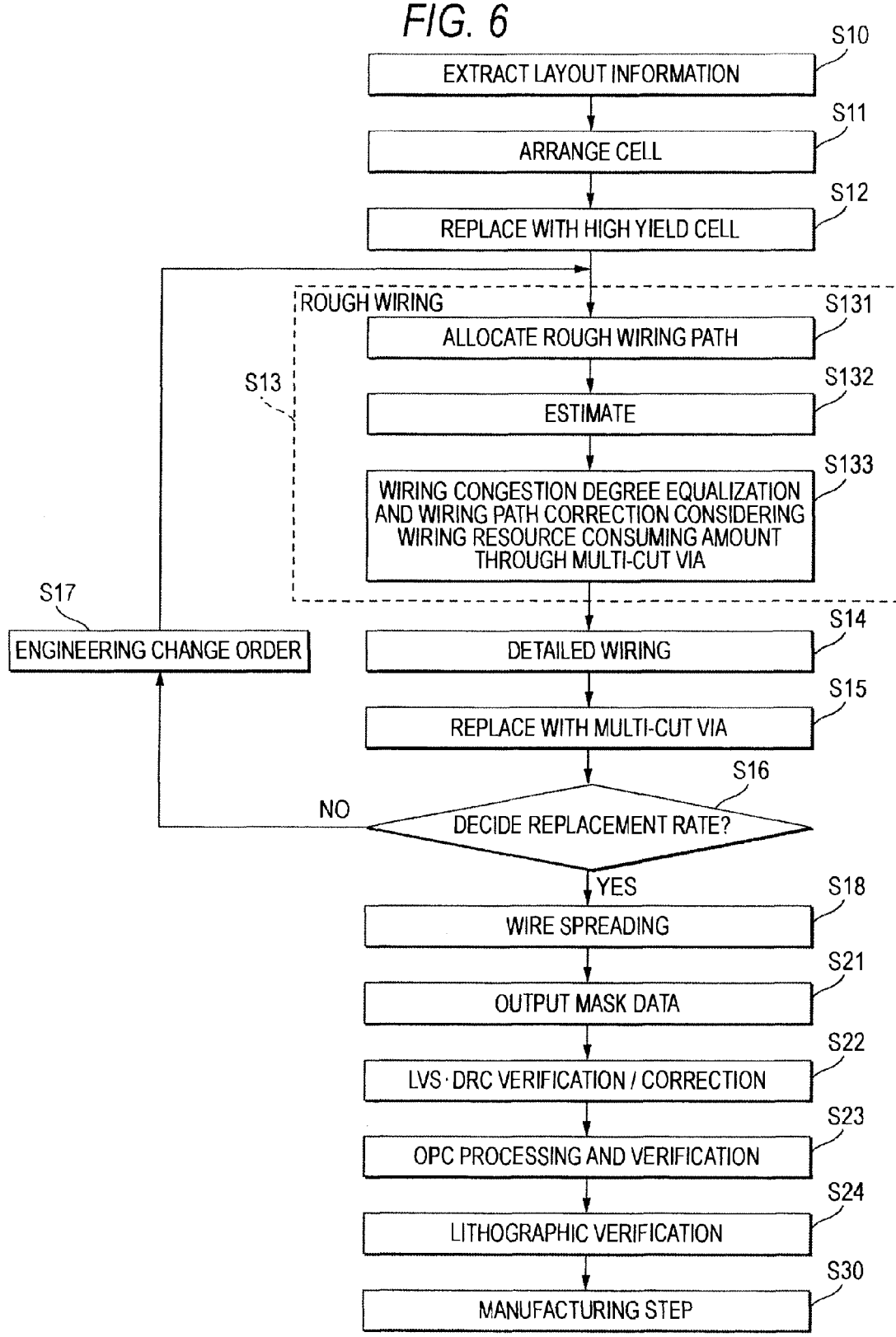
FIG. 6 is an exemplary flowchart showing the method of designing a semiconductor integrated circuit according to the embodiment.

On the other hand, according to the method of designing a semiconductor integrated circuit shown in FIG. 6, at the rough wiring step of the Step S13, the wiring congestion degree is equalized in consideration of the wiring resource consuming amount through the multi-cut via to carry out an optimization into the rough wiring path 22 subjected to the optimization of the rough wiring path allocation. As shown in FIG. 3, consequently, an adjacent wiring track on the periphery of the via is provided to dispose the detailed wiring. At the detailed wiring step shown in the Step S14, therefore, the detailed wiring is not provided around the via. As shown in FIG. 4, consequently, the replacement with the multi-cut via after the detailed wiring can easily be carried out and the multi-cut via replacement rate can be enhanced.

According to the method of designing a semiconductor integrated circuit shown in FIG. 6, moreover, the rough wiring path 22 is optimized at the correcting step shown in the Step S133 so that a positional interval between the wirings is distributed, resulting in an enhancement in a dimensional tolerance of a pattern. Even if the wire spreading processing shown in the Step S18 is executed after the detailed wiring, therefore, the bend of the wiring is generated with difficulty. An unnecessary crank of a wiring segment is also decreased and an excessive wiring congestion on the periphery of the via can also be relieved, and the replacement from the single cut via into the multi-cut via can be carried out at a higher replacement rate than that in the execution of the replacement in the succeeding steps. Furthermore, it is also possible to suppress the generation of a pattern which deteriorates a manufacturing easiness lithographically.

According to the method of designing a semiconductor integrated circuit according to the embodiment, thus, it is possible to design a layout of a semiconductor integrated circuit which rarely has a poor connecting reliability caused by a single cut via and is robust to a variation due to a fluctuation in a manufacture.

(Design Support Program of Semiconductor Integrated Circuit)

A serial design processing shown in the flow of FIG. 6 can be executed by controlling the design support system shown in FIG. 1 in accordance with a program of an equivalent algorithm to that in FIG. 6. The program is stored in a computer readable recording medium and the program storing device 2 is caused to read the recording medium so that the serial automatic design processing according to the embodiment can also be executed. The "computer readable recording medium" implies media capable of recording a program, for example, an external memory device of a computer, a semiconductor memory, a magnetic disk, an optical disk, a magneto-optical disk and a magnetic tape. Moreover, programs stored in these recording media can also be installed into the program storing device 2 constituting a computer system. By connecting a predetermined drive device, it is also possible to use an ROM to be a memory device utilized in a game pack and a magnetic tape device, for example. Furthermore, it is also possible to store the program in the program storing device 2 through a computer network such as internet.

(Method of Manufacturing Semiconductor Integrated Circuit)

An example of a method of manufacturing a semiconductor integrated circuit using the design support system shown in FIG. 1 will be described with reference to a flowchart of FIG. 8. The method of manufacturing a semiconductor storing device which will be described below is only illustrative. The method can be implemented by various other manufacturing methods including a variant.

At Step S100, a layout design of the semiconductor integrated circuit is carried out. More specifically, as described with reference to the flowchart of FIG. 6, at the Step S13, the necessary wiring resource information for connecting the rough wiring path 22 allocated to a plurality of wiring regions in the internal circuit region 10 shown in FIG. 2 through the multi-cut vias calculated and the allocation of the rough wiring path 22 is optimized in order to equalize the wiring congestion degree to be calculated for the rectangular regions 100a to 100i in the respective upper wiring layers of the rectangular regions 100a to 100i, respectively.

At the Step S14, furthermore, the result of the allocation of the rough wiring path 22 obtained after the optimization is read and the detailed wiring is provided in the wiring region having a plurality of layers. At the Step S15, the result of wiring of the detailed wiring is read and the single cut via connecting the wiring region having the layers is replaced with the multi-cut via.

At the Step S16, moreover, the wiring information obtained after the replacement is read and it is decided whether the specified value of the replacement rate is satisfied or not. At the Step S18, the wiring space of the detailed wiring is relaxed.

At the Step S21, then, the wiring information obtained after the wiring space relaxation which is stored in the wiring information storing portion 33 is displayed on the display device 6. At the Steps S22 to S24, thereafter, the verifying unit 17 executes the circuit verification, the LVS•DRC verification, the OPC•MDP verification and a lithographic verification for the layout data displayed on the display device 6 so that the preparation of the mask data is completed.

At Step S200 in FIG. 8, necessary numbers of mask (reticule) sets for a substrate step and a wiring step respectively are mutually manufactured with a predetermined joining margin by a pattern generator such as an electron beam exposing device based on the mask data which are obtained.

At Step S300, there is carried out a chip manufacturing process using the reticule sets manufactured at the Step S200. The chip manufacturing process includes a prestep shown in Step S301 and a poststep shown in Step S304. First of all, at a front end step (substrate step) shown in Step S302, a plurality of chip patterns is periodically arranged on a semiconductor wafer to carry out a microprocessing by a sequential reduction exposing device (stepper) using the respective reticules required for the steps (the manufacturing process).

More specifically, for example, a silicon oxide film is selectively etched at a silicon oxide film depositing step over a silicon substrate in Step S310, a photoresist film coating step over the silicon oxide film in Step S311 and a photolithographic step in Step S312. Furthermore, there are repeated various steps such as a selective implanting step of an impurity ion using a photoresist film and the silicon oxide film as masks in Step S313 and a treatment for activating the implanted ion in Step S314. The various steps are carried out by using the reticules in the reticule sets in order. Thus, a transistor of each cell is formed.

After the front end step shown in the Step S302, a desirable pattern is drawn by the stepper using the necessary reticule for each step in a back end step shown in Step S303 (a surface wiring step) so that a wiring processing is carried out for the surface of the substrate. More specifically, as shown in Step S315, one of the reticule sets at the surface wiring step is used to carry out a formation over a silicon substrate by a CVD method or a PVD method, for example, and the surface is flattened by a chemical mechanical polishing (CMP) method. As shown in Step S316, an interlayer insulating film is coated with a photoresist. A photoresist film is subjected to patterning at a photolithographic step shown in Step S317. Thus, an etching mask is formed.

At Step S318, the etching mask is used to carry out reactive ion etching (RIE) to provide a plurality of via holes for forming a multi-cut via for connecting wirings of upper and lower layers on the interlayer insulating film. The photoresist is removed and the surface is washed. At Step S319, then, a metal is deposited in the vias to form the multi-cut via. A serial steps of forming a new etching mask again at the photolithographic step and patterning the metal film is repeated by using the reticules in the reticule sets in order. Thus, a multilayer wiring structure is formed.

After the surface wiring step is completed, an assembling step in the Step S304 and an inspecting step in Step S400 are carried out so that a product is shipped in Step S500.

According to the method of manufacturing a semiconductor integrated circuit in accordance with the embodiment, the multi-cut via having a plurality of vias is formed on the interlayer insulating film. Also in the case in which one of the vias causes a connecting failure, consequently, a conduction can be taken by the other vias. Therefore, it is possible to enhance a yield of the semiconductor integrated circuit. At the designing step in the Step S100, moreover, the positions in which the adjacent wirings are to be provided around the multi-cut via are also optimized. Therefore, it is possible to manufacture a semiconductor integrated circuit in which the replacement rate of the multi-cut via is high and a great reliability can be obtained.

According to the above-embodiments, it is possible to provide a design support system of a semiconductor integrated circuit. a method of designing a semiconductor integrated circuit, a design support program of a semiconductor integrated circuit, and a method of manufacturing a semiconductor integrated circuit which can increase a replacement rate from a single cut via into a multi-cut via and can enhance a reliability and a manufacturing yield in the semiconductor integrated circuit.

While the invention has been described based on the embodiments, it is not understood that the invention is restricted to the statement and the drawings which constitute a part of the disclosure. From the disclosure, various alternative embodiments, examples and application techniques are apparent to the skilled in the art. The invention includes various embodiments which have not been described above. Accordingly, the technical range of the invention is determined by only the specific matters of the invention according to the claims which are proper from the description.

FIG. 1
(1) calculation processing portion
(2) program storing device
(3) data storing device
(4) input/output control portion
(5) input device
(6) display device
(7) output device
(11) a cell arranging unit
(12) a high yield cell replacing unit
(13) a rough wiring unit
(14) a detailed wiring unit
(15) a multi-cut via replacing unit
(16) a wire spreading unit
(17) a verifying unit
(18) a deciding unit
(31) layout information storing portion
(32) cell arrangement information storing portion
(33) wiring information storing portion
(34) estimation information storing portion
(35) replacement information storing portion
(36) wire spreading information storing portion
(37) verification information storing portion
(131) a rough path allocating unit
(132) a estimating unit
(133) a wiring congestion degree equalizing and wiring path correcting unit considering wiring resource consuming amount through multi-cut via
FIG. 2
(40a) I/O cell region
(22) rough wiring path
(23) high yield cell
(101) rough wiring grid
(8d) terminal
(10) internal circuit region FIG. 3
(63) single cut via
(101) rough wiring grid
(102) detailed wiring grid
Lower wiring
Upper wiring
FIG. 4
(64) multi-cut via
(101) rough wiring grid
(102) detailed wiring grid
FIG. 5A
(51) upper wiring
(61) via
(41) lower wiring
a. Replace
FIG. 5B
b. Or
FIG. 5c
c. In case of DRC error in (b) and (c)
d. In case in which DRC error is not eliminated in (b) to (e)
FIG. 6
(S10) Extract layout information
(S11) Arrange cell
(S12) Replace with high yield cell
(S13) Rough wiring
(S131) Allocate rough wiring path
(S132) Estimate
(S133) Wiring congestion degree equalization and wiring path correction considering wiring resource consuming amount through multi-cut via
(S14) Detailed wiring
(S15) Replace with multi-cut via
(S16) Decide replacement rate ?
(S17) Engineering change order
(S18) Wire spreading
(S21) Output mask data
(S22) LVS•DRC verification/correction
(S23) OPC processing and verification
(S24) Lithographic verification
(S30) Manufacturing step
FIG. 7
(102) detailed wiring grid
(65) single cut via
(101) rough wiring grid
FIG. 8
(S100) designing step
(S200) mask fabricating step
(S300) chip manufacturing step
(S301) prestep
(S302) front end step (substrate step)
(S310) oxidizing step
(S311) resist coating step
(S312) photographic step
(S313) ion implanting step
(S314) heat treating step
(S303) back end step (surface wiring step)
(S315) CVD step
(S316) resist coating step
(S317) photolithographic step
(S318) etching step
(S319) metal depositing step
(S304) poststep (assembling) step
(S400) inspecting step
(S500) shipping step

What is claimed is:

1. A method of manufacturing a semiconductor integrated circuit, the method comprising:

allocating a rough wiring path to a wiring region having a plurality of layers;

estimating a number of vias generated in the rough wiring path;

calculating necessary wiring resource consuming information indicating a number of adjacent wiring paths which can be consumed when a multi-cut via is used;

calculating a wiring congestion degree for each of a plurality of rectangular regions, wherein the plurality of rectangular regions are obtained by dividing the wiring region;

equalizing the wiring congestion degree including a provision of the multi-cut via;

replacing a single-cut via with a replacement multi-cut via;

providing a detailed wiring in the wiring region;

manufacturing a mask using the detailed wiring including the replacement multi-cut via; and transferring a pattern of the mask onto a semiconductor wafer.

2. The method according to claim 1, wherein the multi-cut via has a plurality of holes for a connection between the plurality of the layers.

3. The method according to claim 1, further comprising:

arranging a cell in a chip area of the semiconductor integrated circuit based on a floor plan and cell connecting information; and replacing the cell arranged by the cell arranging unit with a high yield cell;

wherein the high yield cell indicates a cell previously optimized by taking into consideration of a yield.

4. The method according to claim 1, wherein the wiring congestion degree is evaluated by calculating a ratio of the number of rough wiring actually allocated to a total number of rough wiring which is preset in the rectangular regions.

* * * * *